United States Patent
Hong et al.

(10) Patent No.: US 8,643,123 B2
(45) Date of Patent: Feb. 4, 2014

(54) METHOD OF MAKING A SEMICONDUCTOR STRUCTURE USEFUL IN MAKING A SPLIT GATE NON-VOLATILE MEMORY CELL

(75) Inventors: Cheong M. Hong, Austin, TX (US); Brian A. Winstead, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 301 days.

(21) Appl. No.: 13/085,533

(22) Filed: Apr. 13, 2011

(65) Prior Publication Data

US 2012/0261769 A1    Oct. 18, 2012

(51) Int. Cl.
*H01L 21/02*    (2006.01)

(52) U.S. Cl.
USPC ............ 257/410; 257/E29.242; 438/591

(58) Field of Classification Search
USPC ............ 257/410, E29.242, E21.158; 438/591
See application file for complete search history.

(56) References Cited

U.S. PATENT DOCUMENTS

| | | | | |
|---|---|---|---|---|
| 6,069,042 | A * | 5/2000 | Chien et al. | 438/266 |
| 6,313,498 | B1 | 11/2001 | Chen | |
| 2003/0113975 | A1 * | 6/2003 | Sandhu et al. | 438/396 |
| 2006/0019436 | A1 * | 1/2006 | Lee | 438/197 |
| 2008/0121974 | A1 * | 5/2008 | Steimle et al. | 257/319 |
| 2009/0042383 | A1 * | 2/2009 | Kim et al. | 438/619 |
| 2009/0256186 | A1 * | 10/2009 | Kang et al. | 257/314 |
| 2009/0256191 | A1 * | 10/2009 | White et al. | 257/319 |
| 2011/0165749 | A1 * | 7/2011 | Winstead et al. | 438/287 |

OTHER PUBLICATIONS

U.S. Appl. No. 12/683,972, Inventor Brian A. Winstead, et al., Method of Making a Semiconductor Structure Useful in Making a Split Gate Non-Volatile Memory Cell, filed Jan. 7, 2010.
U.S. Appl. No. 11/926,323, Inventor Sung-Taeg Kang, et al., Split Gate Device and Method for Forming, filed Oct. 29, 2007.
Bhattacharya, S., et al., Improved Performance and Reliability of Split Gate Source-Side Injected Flash Memory Cells, IEEE, 1996.

* cited by examiner

*Primary Examiner* — Wael Fahmy
*Assistant Examiner* — Sarah Salerno
(74) *Attorney, Agent, or Firm* — Mary Jo Bertani; Jonathan N. Geld

(57) ABSTRACT

A semiconductor device comprises a semiconductor substrate and a select gate structure over a first portion of the semiconductor substrate. The select gate structure comprises a sidewall forming a corner with a second portion of the semiconductor substrate and a charge storage stack over an area comprising the second portion of the semiconductor substrate, the sidewall, and the corner. A corner portion of a top surface of the charge storage stack is non-conformal with the corner, and the corner portion of the top surface of the charge storage stack has a radius of curvature measuring approximately one-third of a thickness of the charge storage stack over the second portion of the substrate or greater. A control gate layer is formed over the charge storage stack. A portion of the control gate layer conforms to the corner portion of the top surface of the charge storage stack.

20 Claims, 6 Drawing Sheets

METHOD OF MAKING A SEMICONDUCTOR STRUCTURE USEFUL IN MAKING A SPLIT GATE NON-VOLATILE MEMORY CELL

BACKGROUND

1. Field

This disclosure relates generally to methods of making semiconductor structures, and more specifically, to methods useful in making a split gate non-volatile memory cell.

2. Related Art

Split gate non-volatile memories (NVMs) have been developed as providing advantages over the typical control gate over a floating gate. One advantage is that program disturb is reduced for memory cells that are unselected but are either on the selected row or in the alternative on the selected column. Normally cells on the selected row or the selected column are the most likely to be a problem for disturb regardless of the operation that is being performed on a selected cell. With the split gate memory cell having substantially solved the program disturb problem for cells on the selected rows or columns, a disturb problem with cells on unselected rows and unselected columns has become significant. One of the reasons is that the particular stress that is applied is applied for cell on unselected rows and columns is applied for many more cycles than for a stress that is applied for cells on a selected row or column.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

A method of making a semiconductor structure useful for making split gate memory cells includes forming a built-up section at the corner between the select gate and the substrate. This process has the effect of rounding the control gate corner thus reducing the electric field emanating from the corner to an area of the substrate where unwanted carrier generation may occur for a given voltage difference between the control gate and the select gate. Thus, for a given voltage difference between the control gate and the select gate there is reduced carrier generation in the substrate arising from the electric field at the corner. With reduced carrier generation, there is less disturb of erased, unselected bits during programming. This is better understood by reference to the following description and the drawings.

Figure 1:
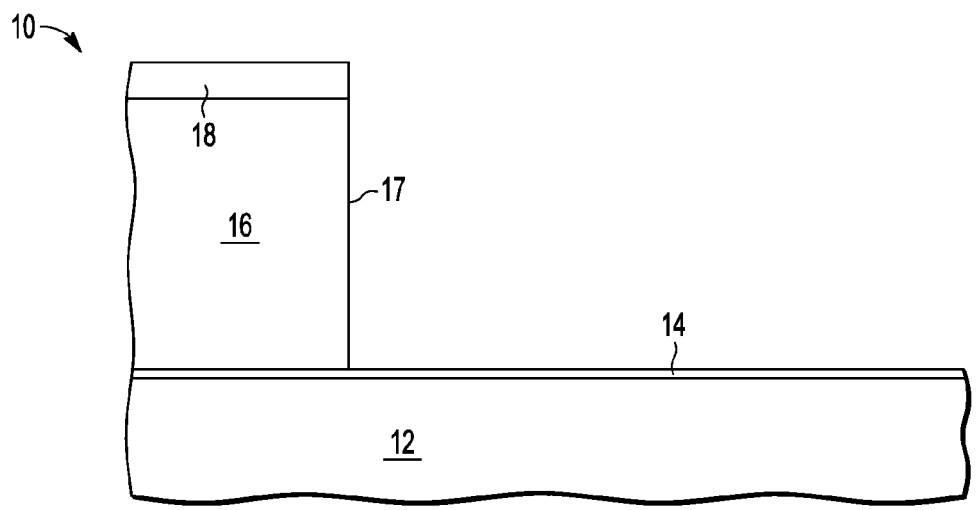
FIG. 1 is a semiconductor device at a stage in processing according to a first embodiment.

Shown in FIG. 1 is an embodiment of semiconductor device 10 comprising a semiconductor substrate 12, a gate dielectric 14 on semiconductor substrate 12, a conductive layer 16, which will be used for a select gate, over a portion of gate dielectric 14, and an antireflective coating (ARC) 18 on conductive layer 16. The semiconductor substrate 12 can be any semiconductor material or combinations of materials, such as gallium arsenide, silicon germanium, silicon-on-insulator (SOI), silicon, monocrystalline silicon, the like, and combinations of the above. Gate dielectric 14 may be a grown oxide which is common for gate dielectrics and may be 2 nanometers or other suitable dimension in thickness. A high K dielectric may also be used and would likely have a different thickness.

Conductive layer 16 may be doped polysilicon 150 nanometers thick in this example but could be another suitable material and thickness. Conductive layer 16 has been etched according to a pattern to leave a side 17 as shown in FIG. 1. The bottom portion of the side 17 has a corner, which may be called a lower corner, that is relatively sharp.

Figure 2:
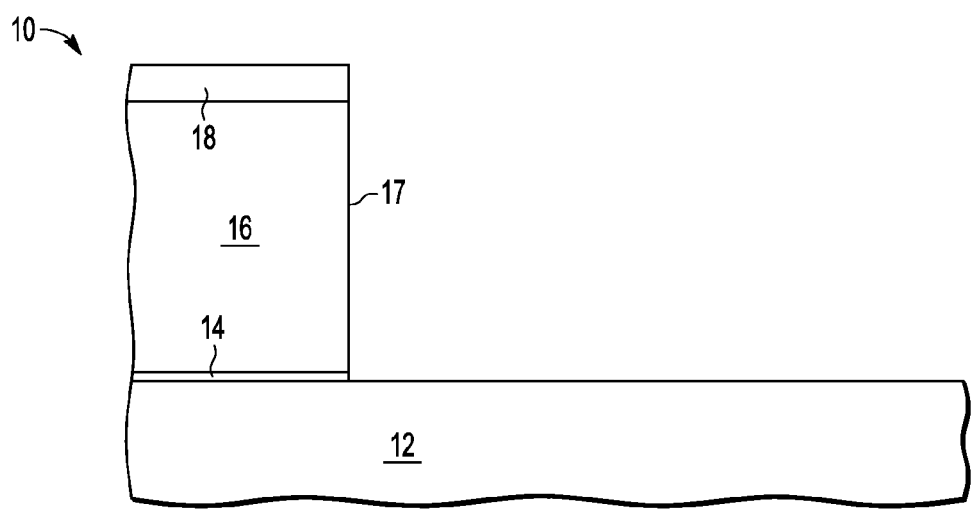
FIG. 2 is the semiconductor device of FIG. 1 at a subsequent stage in processing.

Shown in FIG. 2 is an embodiment of semiconductor device 10 after performing an anisotropic etch or isotropic etch to remove gate dielectric 14 in an area adjacent to the side 17 of conductive layer 16. For the case of gate dielectric 14 being silicon oxide, this easily achieved using a reactive ion etch (RIE) or an HF wet etch. Another isotropic etch may be used. For the case of gate dielectric 14 being a high K dielectric, a different etchant, one that is selective between the high K dielectric and the semiconductor material of substrate 12, could be used.

Figure 3:
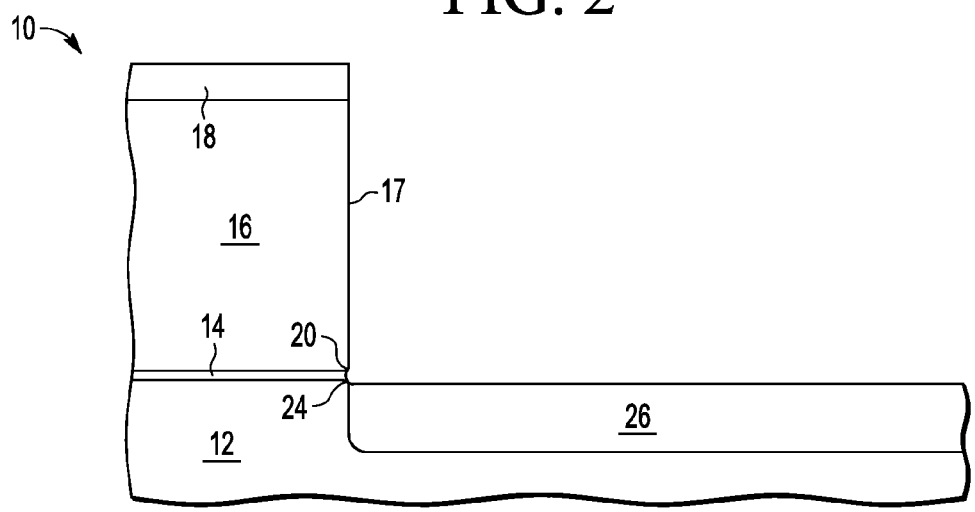
FIG. 3 is the semiconductor device of FIG. 2 at a subsequent stage in processing.

After etching gate dielectric layer 14, another oxidation layer (not shown) may be formed and removed by etching. a small amount of rounding of lower corner 20 of conductive layer 16 may occur during the oxidation, as shown in FIG. 3. The oxidation and second etch may also form a recess 24 in a portion of substrate 12 adjacent to the side of conductive layer 16.

After the selected portion of oxide 14 is removed, an implant of dopant type opposite that of substrate 12 which may be called counterdoping, may be performed to form region 26 in substrate 12. Typically, substrate 12 would have a light P doping. In this example region 26 is N type resulting from the implantation.

Figure 4:
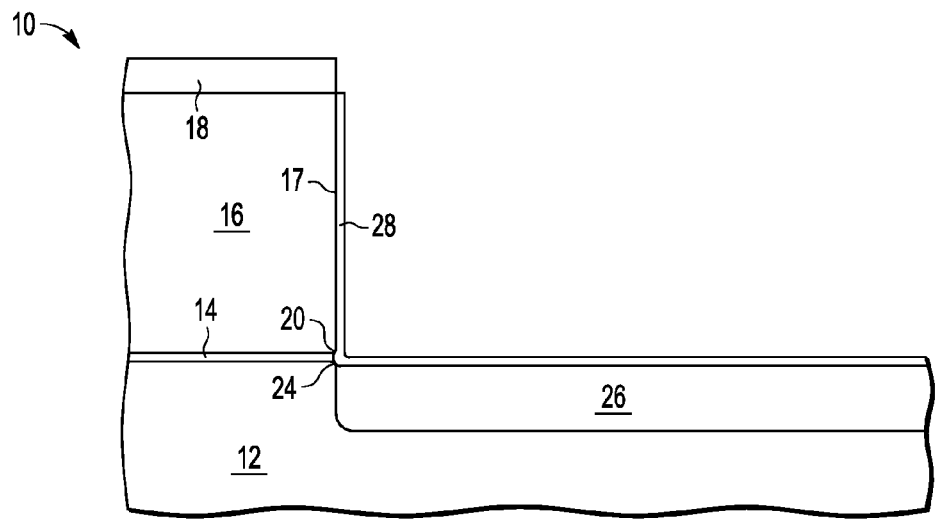
FIG. 4 is the semiconductor device of FIG. 3 at a subsequent stage in processing.

Shown in FIG. 4 is an embodiment of semiconductor device 10 after growing or depositing a dielectric layer 28 on the exposed portion of substrate 12 in recess 24 and the side 17 of conductive layer 16. Dielectric layer 28 may have a low dielectric constant (e.g., silicon oxide) or a relatively high dielectric constant greater than approximately 7-7.5 (i.e., greater than silicon nitride). Dielectric layer 28 may be about 40 to 100 Angstroms or other suitable dimension in thickness.

Figure 5:
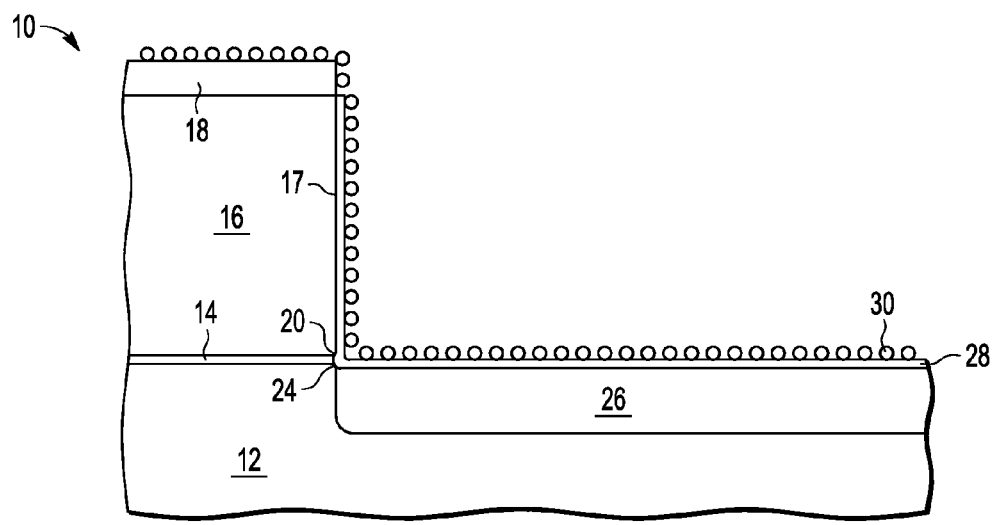
FIG. 5 is the semiconductor device of FIG. 4 at a subsequent stage in processing.

Shown in FIG. 5 is an embodiment of semiconductor device 10 after forming a charge storage layer 30 on the top and side of ARC layer 18, and dielectric layer 28. Charge storage layer 30 may be formed by depositing and annealing discrete storage elements of polysilicon, germanium, metal, silicon carbide, or other suitable metal or silicon material or any combinations of these materials. In the illustrated embodiment, charge storage layer 30 includes small circles representing nanocrystals, however, charge storage layer 30 may be formed of a continuous layer of silicon nitride, polysilicon or other suitable material. Charge storage layer 30 may be between 5 and 30 nanometers thick. Dielectric layer 28 may be a thermal layer in order to withstand the heat of nanocrystal formation. A high-k dielectric material may be used as dielectric layer 28 with metal nanocrystals or when a lower temperature silicon nanocrystal formation process is used.

Figure 6:
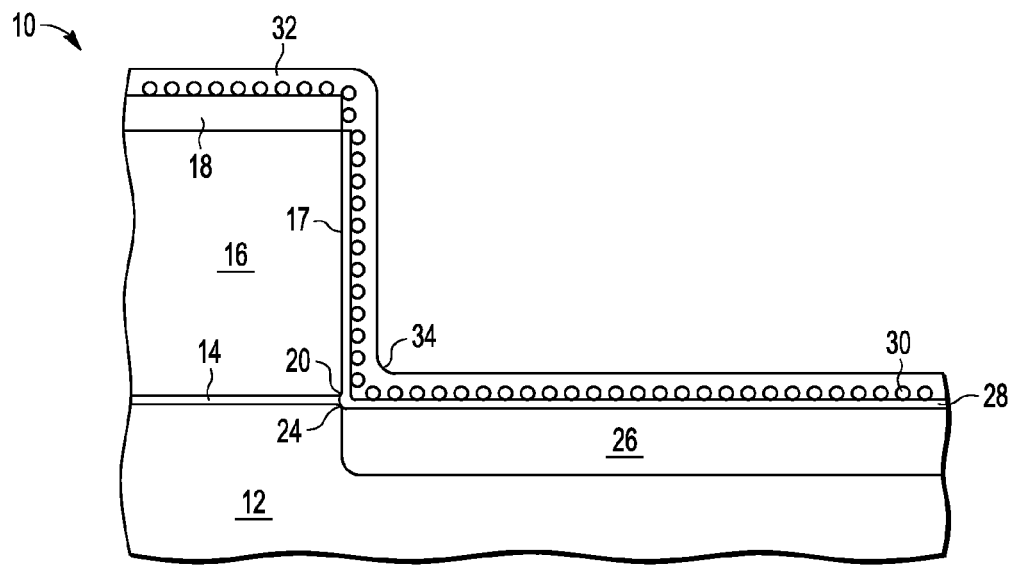
FIG. 6 is the semiconductor device of FIG. 5 at a subsequent stage in processing.

Shown in FIG. 6 is an embodiment of semiconductor device 10 after dielectric layer 32 is formed over the charge storage layer 30 to isolate charge storage layer 30 from subsequently formed layers. Dielectric layer 32 is formed in a manner that establishes a rounded corner 34 over charge storage layer 30 near the lower corner 20 of select gate 16 and doped region 26. Corner 34 has a higher build-up of material than the rest of dielectric layer 32, as more fully described herein with reference to FIG. 12.

Figure 7:
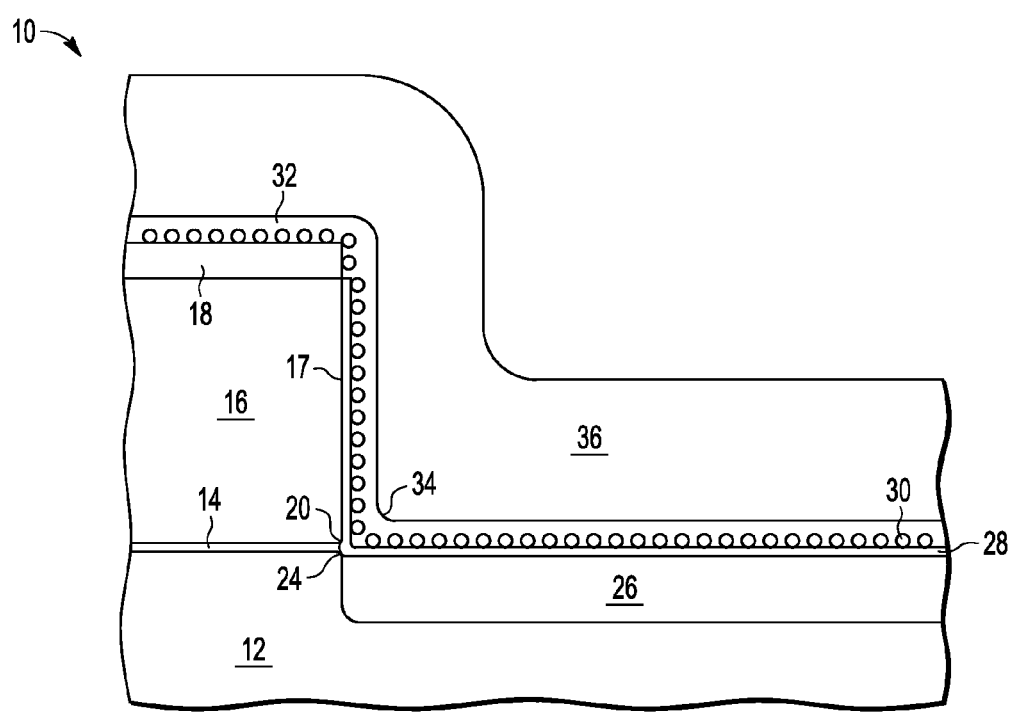
FIG. 7 is the semiconductor device of FIG. 6 at a subsequent stage in processing.

Shown in FIG. 7 is an embodiment of semiconductor device 10 after depositing a conductive layer 36 over dielectric layer 32. Conductive layer 36 may be doped polysilicon which is convenient from a processing perspective but could be another conductive material or combination of materials. Conductive layer 36 will be patterned in subsequent steps to result in a control gate.

Figure 8:
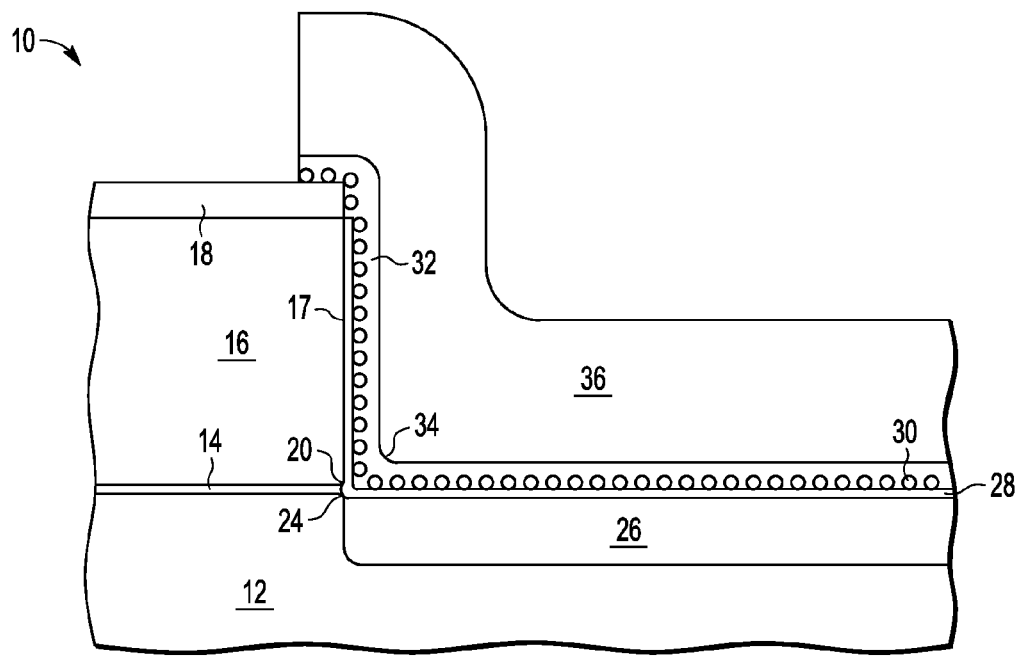
FIG. 8 is the semiconductor device of FIG. 7 at a subsequent stage in processing.

Shown in FIG. 8 is an embodiment of semiconductor device 10 after dielectric layer 28, charge storage layer 30, dielectric layer 32, and conductive layer 36 have been patterned in an overlapping split gate structure over ARC layer 18.

Figure 9:
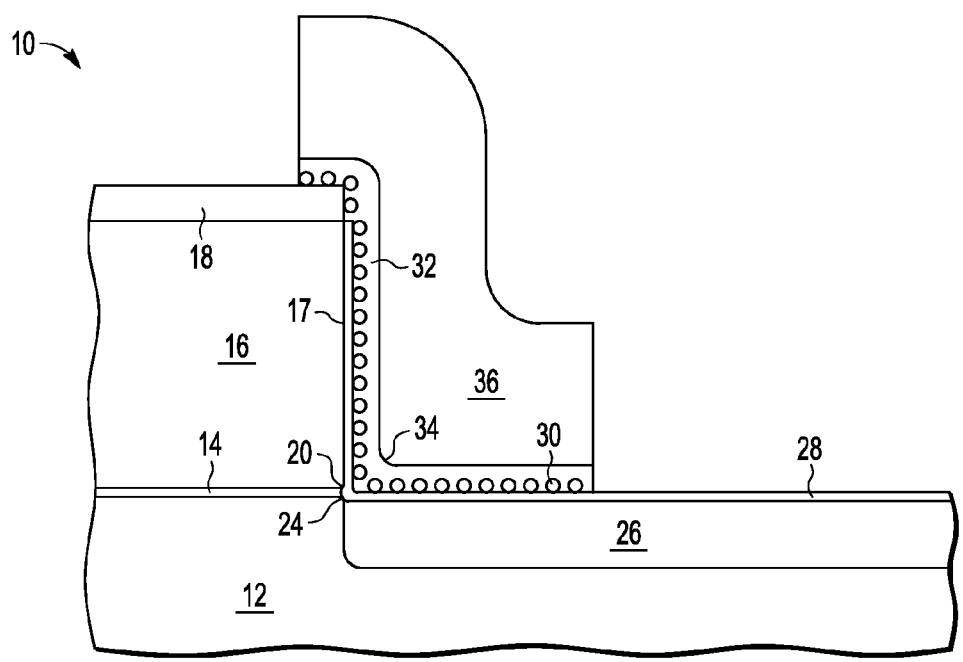
FIG. 9 is the semiconductor device of FIG. 8 at a subsequent stage in processing.

Shown in FIG. 9 is an embodiment of semiconductor device 10 after etching conductive layer 36 and charge storage layer 30, and dielectric layer 32 over a portion of dielectric layer 28 to form a side of conductive layer 36 over dielectric layer 28.

Figure 10:
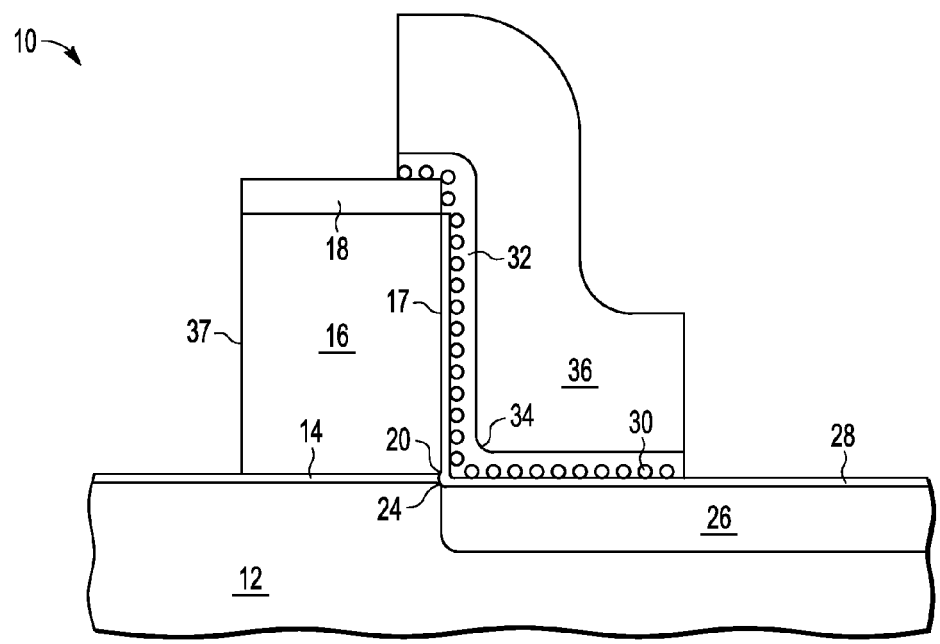
FIG. 10 is the semiconductor device of FIG. 9 at a subsequent stage in processing providing a split gate NVM cell.

Shown in FIG. 10 is an embodiment of semiconductor device 10 after patterning a side 37 of conductive material 16 and ARC layer 18 to form a select gate. The patterning of a side of conductive layer 36 and a side 37 of conductive material 16 may be combined in the same etching step.

Figure 11:
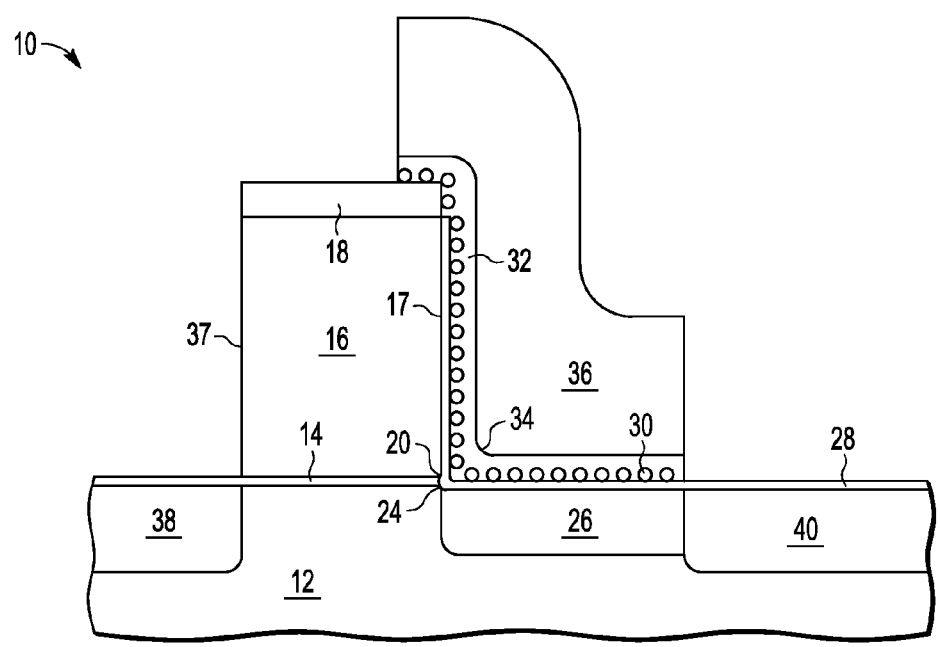
FIG. 11 is the semiconductor device of FIG. 10 at a subsequent stage in processing to provide a split gate NVM cell.

Shown in FIG. 11 is an embodiment of semiconductor device 10 after forming a drain 38 and a source 40 to result in a non-volatile memory (NVM) cell with the resulting portion of conductive layer 16 forming a select gate and the resulting portion of conductive layer 36 forming a control gate. In some embodiments, an array of split-gate type NVM cells can be formed on a single substrate 12.

Semiconductor device 10 may undergo further processing as known by those skilled in the art such as, for example, forming sidewall spacers on exposed sidewalls. Source region 38, drain region 40, and other structures can then be silicided using conventional processing techniques. In addition, one or more metal interconnect layers (not shown) may be formed to provide electrical connections for components on semiconductor device 10.

Also note that a number of intermediate steps have been left out of the description, such as for example, formation of shallow trench isolation (STI), various cleaning steps, multiple steps of gate dielectric formation, various implants, anneal steps, and the like, that one of ordinary skill in the art would know are necessary or desirable in the manufacture of an integrated circuit.

Figure 12:
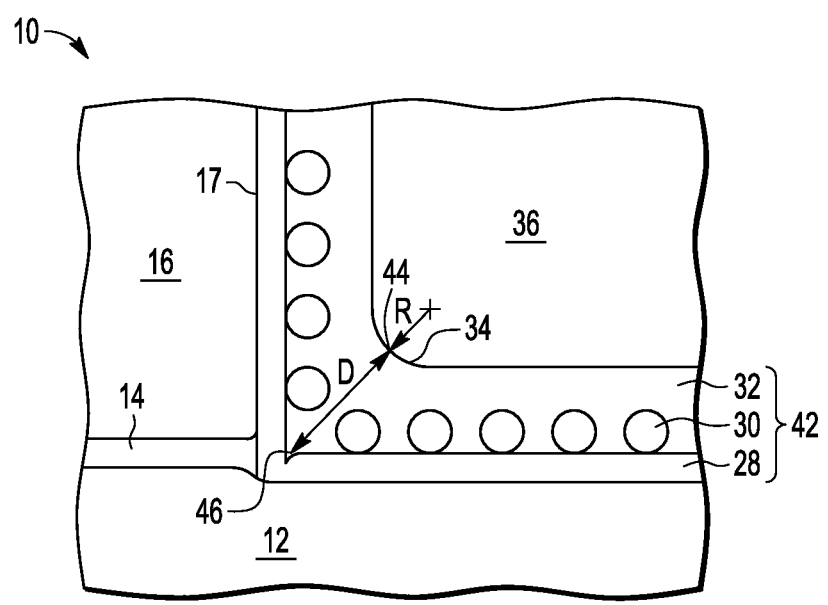
FIG. 12 is a more detailed view of a section of the semiconductor device of FIG. 11.

FIG. 12 is a more detailed view of a section of the semiconductor device 10 of FIG. 11. In some embodiments, dielectric layer 28 is 40 to 100 Angstroms thick, charge storage layer 30 is 50 to 300 Angstroms thick, and dielectric layer 32 is 80 to 250 Angstroms thick. Corner 34 may be formed by a non-conformal deposition of tetraethyl orthosilicate (TEOS) at a temperature of 620 to 660 degrees Centigrade, a pressure of 0.3 to 1.0 Torr, and a gas flow of 50 to 150 standard cubic centimeters per minute. The carrier gas for the TEOS can be any suitable inert gas such as nitrogen or argon. Other suitable deposition material(s) and/or carrier gas(es) can be used. The temperature, pressure, and gas flow may vary based on the dimensions of select gate 16 and the extent to which the corner 20 (FIG. 11) is rounded.

In further embodiments, dielectric layer 32 can be formed in two or more layers with a build-up of material in corner 34. The first layer can conform more closely to the corner 20, while the second layer forms the build-up of material in corner 34.

In other embodiments, dielectric layer 32 can be formed with one or more layers of dichlorosilane precursor material using low pressure chemical vapor deposition (LPCVD) at a temperature of approximately 800 degrees Centigrade.

In still further embodiments, the nitride of charge storage layer 30 can be formed with a more rounded corner to facilitate the build-up of corner 34 with dielectric layer 32.

In yet other embodiments, a larger recess 24 can be formed with a more rounded corner to facilitate the buildup of corner 34 with one or more layers of charge storage stack 42.

In some embodiments, the radius of curvature R of corner 34 is greater than 100 Angstroms. In terms of ratios of dimensions, the radius of curvature R may be greater than or equal to 0.3 times the height of charge storage stack 42. The distance D from a point 44 on curve 34 to a corner 46 of dielectric layer 28 adjacent the junction of the edge of select gate 16 and gate dielectric 14 may be greater than or equal to approximately 40 Angstroms plus 1.4 times the height of charge storage stack 42.

Rounded corner 34 is beneficial in reducing the high electric field that is generally formed at corners. The electric field is higher if the corner is sharper. With the corner rounded, the electric field is lower. A voltage differential between control gate 36 and select gate 16, which occurs when the memory cell of FIG. 11 is unselected during the programming of another cell, causes an electric field at corner 34 which extends into substrate 12 including under storage layer 30. If the electric field is high enough, unwanted carriers can be generated. If these carriers gain sufficient energy, they can tunnel to nearby nanocrystals. Thus, rounded corner 34 by having reduced sharpness, reduces the electric field extending into substrate 12 and thus reduces carriers that can tunnel to the nanocrystals of storage layer 30.

By now it should be appreciated that there has been provided a method of making a semiconductor device comprising forming a select gate dielectric layer over a semiconductor substrate; forming a select gate layer over the select gate dielectric layer; and forming a select gate sidewall of the select gate layer and the select gate dielectric layer by removing at least a portion of the select gate layer and the select gate dielectric layer, which exposes a surface of the semiconductor substrate. A charge storage stack is formed over at least a portion of the exposed surface of the semiconductor substrate and at least a portion of the select gate sidewall. A corner portion of a top surface of the charge storage stack is non-conformal with a corner region between the select gate sidewall and the exposed surface of the semiconductor substrate. The corner portion of the top surface of the charge storage stack has a radius of curvature measuring approximately one-third of a thickness of the charge storage stack over the substrate surface or greater. A control gate layer is formed over the charge storage stack.

In another aspect, forming the charge storage stack further comprises forming a bottom dielectric layer over the select gate sidewall and the exposed surface of the semiconductor substrate; forming a charge storage layer over the bottom dielectric layer; and forming a top dielectric layer over the charge storage layer. One or more of the bottom dielectric layer, the charge storage layer and the top dielectric layer are formed such that a result of said forming the charge storage stack is the radius of curvature of the corner portion of the top surface of the charge storage stack.

In another aspect, forming the top dielectric layer comprises forming a layer comprising silicon dioxide, and using a low pressure chemical vapor deposition process. The low pressure chemical vapor deposition process comprises using tetraethyl orthosilicate (TEOS) as a precursor, and a result of said forming the top dielectric layer is the radius of curvature of the corner portion of the top surface of the charge storage stack.

In another aspect, the low pressure chemical vapor deposition process further comprises operating at a process temperature between 620 to 660 degrees celcius; using a process gas flow ratio of 50 to 150 sccm nitrogen to 100-200 sccm TEOS; and operating at a process pressure between 0.3 to 1.0 Torr.

In another aspect, forming the top dielectric layer further comprises forming a first top dielectric layer over the charge storage layer; and forming a second top dielectric layer over the first top dielectric layer. Forming the second top dielectric layer comprises said forming the layer comprising silicon dioxide using the low pressure chemical vapor deposition process. A result of said forming the second top dielectric layer is the radius of curvature of the corner portion of the top surface of the charge storage stack.

In another aspect, forming the top dielectric layer comprises forming a layer comprising silicon dioxide, using a low pressure chemical vapor deposition process with dichlorosilane (DCS) as a precursor.

In another aspect, forming the bottom dielectric layer comprises forming a layer comprising silicon dioxide, using a low pressure chemical vapor deposition process. A result of said forming the bottom dielectric layer is a top surface of the bottom dielectric layer is non-conformal with the corner region between the select gate sidewall and the exposed surface of the semiconductor substrate, and another result of said forming the bottom dielectric layer is the radius of curvature of the corner portion of the top surface of the charge storage stack.

In another aspect, the charge storage layer is formed such that a top surface of the charge storage layer is non-conformal with the corner region between the select gate sidewall and the exposed surface of the semiconductor substrate, and a result of said forming the charge storage layer is the radius of curvature of the corner portion of the top surface of the charge storage stack.

In another aspect, the radius of curvature of the corner portion of the top surface of the charge storage stack is at least 100 Ångstroms.

In another aspect, forming the bottom dielectric layer comprises growing an oxide layer over the select gate sidewall and the exposed surface of the semiconductor substrate. Forming the charge storage layer comprises forming a layer comprising at least one of nanocrystals and nitride, and forming the top dielectric layer comprises depositing an oxide layer.

In another aspect, the bottom dielectric layer comprises a layer thickness between 40 to 100 Ångstroms. The charge storage layer comprises a layer thickness between 50 to 300 Ångstroms, and the top dielectric layer comprises a layer thickness between 80 to 250 Ångstroms.

In another aspect, the bottom dielectric layer comprises an oxide layer of a thickness between 40 to 100 Ångstroms, the charge storage layer comprises a polysilicon layer of a thickness between 300-500 Ångstroms, and the top dielectric layer comprises an oxide layer of a thickness between 80 to 250 Ångstroms.

In another aspect, the control gate layer is formed to conform to the corner portion of the top surface of the charge storage stack.

In another embodiment, a semiconductor device comprises a semiconductor substrate and a select gate structure over a first portion of the semiconductor substrate. The select gate structure comprises a sidewall forming a corner with a second portion of the semiconductor substrate and a charge storage stack over an area comprising the second portion of the semiconductor substrate, the sidewall, and the corner. A corner portion of a top surface of the charge storage stack is non-conformal with the corner, and the corner portion of the top surface of the charge storage stack has a radius of curvature measuring approximately one-third of a thickness of the charge storage stack over the second portion of the substrate or greater. A control gate layer is formed over the charge storage stack. A portion of the control gate layer conforms to the corner portion of the top surface of the charge storage stack.

In another aspect, forming the charge storage stack further comprises: a bottom dielectric layer over the sidewall and the surface of the second portion of the semiconductor substrate; a charge storage layer over the bottom dielectric layer; and a top dielectric layer over the charge storage layer. One or more of the bottom dielectric layer, the charge storage layer, and the top dielectric layer are formed such that a corner portion of a top surface of the layer is non-conformal with the corner and a result of said forming is the radius of curvature of the corner portion of the top surface of the charge storage stack.

In another aspect, the top dielectric layer further comprises a first top dielectric layer over the charge storage layer; and a second top dielectric layer over the first top dielectric layer. The second top dielectric layer comprises silicon dioxide, and the second top dielectric layer provides the radius of curvature of the corner portion of the top surface of the charge storage stack.

In another aspect, the top dielectric layer further comprises a layer of silicon dioxide formed using a low pressure chemical vapor deposition process having tetraethyl orthosilicate (TEOS) as a precursor. The top dielectric layer provides the radius of curvature of the corner portion of the top surface of the charge storage stack.

In another aspect, the top dielectric layer further comprises a layer of silicon dioxide formed using a low pressure chemical vapor deposition process having dichlorosilane (DCS) as a precursor. The top dielectric layer provides the radius of curvature of the corner portion of the top surface of the charge storage stack.

In another aspect, the select gate structure further comprises a select gate dielectric layer over the first portion of the semiconductor substrate; a select gate conductive layer over the select gate dielectric layer; and a select gate anti-reflective coating layer over the select gate conductive layer.

In another aspect, a doped region implanted in the semiconductor substrate. The doped region is adjacent to the sidewall of the select gate structure and beneath the control gate layer.

Although the disclosure has been described with respect to specific conductivity types or polarity of potentials, skilled artisans appreciated that conductivity types and polarities of potentials may be reversed.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. For example, a top oxide and a bottom oxide were described but another insulating material may be substituted. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor device comprising:
   forming a select gate dielectric layer over a semiconductor substrate;
   forming a select gate layer over the select gate dielectric layer;
   forming a select gate sidewall of the select gate layer and the select gate dielectric layer by removing at least a portion of the select gate layer and the select gate dielectric layer, wherein
      said removing further results in exposing a surface of the semiconductor substrate;
   forming a charge storage stack over at least a portion of the exposed surface of the semiconductor substrate and at least a portion of the select gate sidewall, wherein
      a corner portion of a top surface of the charge storage stack is non-conformal with a corner region between the select gate sidewall and the exposed surface of the semiconductor substrate,
   the charge storage stack comprises:
      a first to dielectric layer over a charge storage layer; and
      a second to dielectric layer over the first to dielectric layer, the second to dielectric layer is non-conformal with the first to dielectric layer, and
   the corner portion of the top surface of the charge storage stack has a radius of curvature measuring approximately one-third of a thickness of the charge storage stack over the substrate surface or greater; and
   forming a control gate layer over the charge storage stack.

2. The method of claim 1 wherein said forming the charge storage stack further comprises:
   forming a bottom dielectric layer over the select gate sidewall and the exposed surface of the semiconductor substrate;
   forming the charge storage layer over the bottom dielectric layer; and
   forming the top dielectric layer over the charge storage layer, wherein
      one or more of the bottom dielectric layer, the charge storage layer and the top dielectric layer are formed such that a result of said forming the charge storage stack is the radius of curvature of the corner portion of the top surface of the charge storage stack.

3. The method of claim 2 wherein said forming the top dielectric layer comprises:
   forming a layer comprising silicon dioxide, using a low pressure chemical vapor deposition process, wherein
      the low pressure chemical vapor deposition process comprises using tetraethyl orthosilicate (TEOS) as a precursor, and
      a result of said forming the top dielectric layer is the radius of curvature of the corner portion of the top surface of the charge storage stack.

4. The method of claim 3 wherein the low pressure chemical vapor deposition process further comprises:
   operating at a process temperature between 620 to 660 degrees celcius;
   using a process gas flow ratio of 50 to 150 sccm nitrogen to 100-200 sccm TEOS; and
   operating at a process pressure between 0.3 to 1.0 Torr.

5. The method of claim 3 wherein
   the second top dielectric layer is formed using the low pressure chemical vapor disposition process, wherein a result of said forming the second top dielectric layer is the radius of curvature of the corner portion of the top surface of the charge storage stack.

6. The method of claim 2 wherein said forming the top dielectric layer comprises:
   forming a layer comprising silicon dioxide, using a low pressure chemical vapor deposition process with dichlorosilane (DCS) as a precursor.

7. The method of claim 2 wherein said forming the bottom dielectric layer comprises:
   forming a layer comprising silicon dioxide, using a low pressure chemical vapor deposition process, wherein
      a result of said forming the bottom dielectric layer is a top surface of the bottom dielectric layer is non-conformal with the corner region between the select gate sidewall and the exposed surface of the semiconductor substrate, and
      another result of said forming the bottom dielectric layer is the radius of curvature of the corner portion of the top surface of the charge storage stack.

8. The method of claim 2, wherein
   the charge storage layer is formed such that a top surface of the charge storage layer is non-conformal with the corner region between the select gate sidewall and the exposed surface of the semiconductor substrate, and
   a result of said forming the charge storage layer is the radius of curvature of the corner portion of the top surface of the charge storage stack.

9. The method of claim 2 wherein the radius of curvature of the corner portion of the top surface of the charge storage stack is at least 100 Ångstroms.

10. The method of claim 2, wherein
said forming the bottom dielectric layer comprises growing an oxide layer over the select gate sidewall and the exposed surface of the semiconductor substrate,
said forming the charge storage layer comprises forming a layer comprising at least one of nanocrystals and nitride, and
said forming the top dielectric layer comprises depositing an oxide layer.

11. The method of claim 10, wherein
said bottom dielectric layer comprises a layer thickness between 40 to 100 Ångstroms,
said charge storage layer comprises a layer thickness between 50 to 300 Ångstroms, and
said top dielectric layer comprises a layer thickness between 80 to 250 Ångstroms.

12. The method of claim 2, wherein
the bottom dielectric layer comprises an oxide layer of a thickness between 40 to 100 Ångstroms,
the charge storage layer comprises a polysilicon layer of a thickness between 300-500 Ångstroms, and
the top dielectric layer comprises an oxide layer of a thickness between 80 to 250 Ångstroms.

13. The method of claim 1 further comprising:
forming the control gate layer to conform to the corner portion of the top surface of the charge storage stack.

14. A semiconductor device comprising:
a semiconductor substrate;
a select gate structure over a first portion of the semiconductor substrate, wherein
the select gate structure comprises a sidewall forming a corner with a second portion of the semiconductor substrate;
a charge storage stack over an area comprising the second portion of the semiconductor substrate, the sidewall, and the corner, wherein
the charge storage stack comprises:
a bottom dielectric layer over the sidewall and the surface of the second portion of the semiconductor substrate;
a charge storage layer over the bottom dielectric layer; and
a to dielectric layer over the charge storage layer, the to dielectric layer comprises:
a first top dielectric layer over the charge storage layer; and
a second top dielectric layer over the first top dielectric layer;
a corner portion of a top surface of the charge storage stack is non-conformal with the first top dielectric layer and the corner, and
the corner portion of the top surface of the charge storage stack has a radius of curvature greater than or equal to one-third of a thickness of the charge storage stack over the second portion of the substrate or greater; and
a control gate layer over the charge storage stack, wherein a portion of the control gate layer conforms to the corner portion of the top surface of the charge storage stack.

15. The semiconductor device of claim 14,
wherein
one or more of the bottom dielectric layer, the charge storage layer, and the top dielectric layer are formed such that a corner portion of a top surface of the layer is non-conformal with the corner and a result of said forming is the radius of curvature of the corner portion of the top surface of the charge storage stack.

16. The semiconductor device of claim 14 wherein the second top dielectric layer comprises silicon dioxide.

17. The semiconductor device of claim 14 wherein the top dielectric layer further comprises:
a layer of silicon dioxide formed using a low pressure chemical vapor deposition process having tetraethyl orthosilicate (TEOS) as a precursor, wherein
the top dielectric layer provides the radius of curvature of the corner portion of the top surface of the charge storage stack.

18. The semiconductor device of claim 14 wherein the top dielectric layer further comprises:
a layer of silicon dioxide formed using a low pressure chemical vapor deposition process having dichlorosilane (DCS) as a precursor, wherein
the top dielectric layer provides the radius of curvature of the corner portion of the top surface of the charge storage stack.

19. The semiconductor device of claim 14 wherein the select gate structure further comprises:
a select gate dielectric layer over the first portion of the semiconductor substrate;
a select gate conductive layer over the select gate dielectric layer; and
a select gate anti-reflective coating layer over the select gate conductive layer.

20. The semiconductor device of claim 14 further comprising:
a doped region implanted in the semiconductor substrate, wherein the doped region is adjacent to the sidewall of the select gate structure and beneath the control gate layer.

* * * * *

UNITED STATES PATENT AND TRADEMARK OFFICE
CERTIFICATE OF CORRECTION

| | |
|---|---|
| PATENT NO. | : 8,643,123 B2 |
| APPLICATION NO. | : 13/085533 |
| DATED | : February 4, 2014 |
| INVENTOR(S) | : Hong et al. |

It is certified that error appears in the above-identified patent and that said Letters Patent is hereby corrected as shown below:

In the Claims

Column 7, Line 62, Claim 1, please change "a first to dielectric" to be --a first top dielectric--

Column 7, Line 63, Claim 1, please change "a second to dielectric layer over the first to dielectric" to be --a second top dielectric layer over the first top dielectric--

Column 7, Line 64, Claim 1, please change "the second to dielectric" to be --the second top dielectric--

Column 7, Line 65, Claim 1, please change "the first to dielectric" to be --the first top dielectric--

Signed and Sealed this
Sixteenth Day of September, 2014

Michelle K. Lee
*Deputy Director of the United States Patent and Trademark Office*